US012099102B2

(12) United States Patent
Solmeyer et al.

(10) Patent No.: US 12,099,102 B2
(45) Date of Patent: Sep. 24, 2024

(54) DELIVERY OF PUMP LASER INTO PROBE WAVEGUIDE USING OPTICAL DIFFRACTION

(71) Applicant: Honeywell International Inc., Charlotte, NC (US)

(72) Inventors: Neal Eldrich Solmeyer, Edina, MN (US); Matthew Wade Puckett, Phoenix, AZ (US); Matthew Robbins, Minneapolis, MN (US); Eugene Freeman, Eden Prairie, MN (US); Mary Salit, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 78 days.

(21) Appl. No.: 17/725,284

(22) Filed: Apr. 20, 2022

(65) Prior Publication Data

US 2023/0341485 A1 Oct. 26, 2023

(51) Int. Cl.
*G01R 33/26* (2006.01)
*G02B 6/293* (2006.01)
*G02B 6/42* (2006.01)

(52) U.S. Cl.
CPC ......... *G01R 33/26* (2013.01); *G02B 6/29328* (2013.01); *G02B 6/4215* (2013.01)

(58) Field of Classification Search
CPC .. G01R 33/26; G02B 6/29328; G02B 6/4215; G02B 6/29325
See application file for complete search history.

(56) References Cited

U.S. PATENT DOCUMENTS

| 7,266,258 | B2 | 9/2007 | Liu et al. |
| 9,910,105 | B2 | 3/2018 | Boesch et al. |
| 10,317,279 | B2 | 6/2019 | Bruce et al. |
| 10,330,744 | B2 | 6/2019 | Luzod |
| 10,901,054 | B1 | 1/2021 | Chen et al. |

(Continued)

FOREIGN PATENT DOCUMENTS

| CN | 113568246 A | 10/2021 |
| GB | 2408796 A | 6/2005 |

(Continued)

OTHER PUBLICATIONS

Dumeige, et al., "Infrared laser threshold magnetometry with a NV doped diamond intracavity etalon", Optics Express, vol. 27, No. 2, Jan. 21, 2019, pp. 1706 through 1717.
Bougas et al., "On the Possibility of Miniature Diamond-Based Magnetometers Using Waveguide Geometries", Micromachines 2018, 9, 276, Jun. 1, 2018, pp. 1 through 11, MDPI.

(Continued)

*Primary Examiner* — Jay Patidar
(74) *Attorney, Agent, or Firm* — Fogg & Powers LLC

(57) ABSTRACT

Systems and method for the delivery of a pump laser using optical diffraction are described herein. In certain embodiments, a system includes a substrate and a waveguide layer formed on the substrate. The waveguide layer includes a first waveguide of a first material configured to receive a probe laser for propagating within the first waveguide. The waveguide layer additionally includes a second waveguide configured to receive a pump laser for propagating within the second waveguide. Further, the waveguide layer includes one or more diffractors configured to direct a portion of the pump laser out of the second waveguide and through the first waveguide.

14 Claims, 7 Drawing Sheets

(56) References Cited

U.S. PATENT DOCUMENTS

| | | |
|---|---|---|
| 11,119,163 B2 | 9/2021 | Puckett et al. |
| 11,131,619 B2 | 9/2021 | Ozdemir et al. |
| 11,199,733 B2 | 12/2021 | Puckett et al. |
| 2003/0185514 A1 | 10/2003 | Bendett et al. |
| 2014/0354275 A1 | 12/2014 | Sheng et al. |
| 2016/0231394 A1 | 8/2016 | Manickam et al. |
| 2017/0023487 A1 | 1/2017 | Boesch |
| 2017/0343621 A1 | 11/2017 | Hahn et al. |
| 2018/0275210 A1 | 9/2018 | Luzod |
| 2019/0018076 A1 | 1/2019 | Hahn et al. |
| 2019/0219645 A1 | 7/2019 | Hahn et al. |
| 2020/0192007 A1 | 6/2020 | Kwak et al. |
| 2021/0083458 A1* | 3/2021 | Heberle .................. H01S 5/50 |
| 2021/0103166 A1 | 4/2021 | Puckett et al. |
| 2021/0132163 A1 | 5/2021 | Puckett et al. |
| 2023/0221258 A1* | 7/2023 | Waldern .................. G01J 3/44 356/301 |

FOREIGN PATENT DOCUMENTS

| | | |
|---|---|---|
| WO | 2007049260 A1 | 5/2007 |
| WO | 2019002576 A1 | 1/2019 |

OTHER PUBLICATIONS

Jensen et al., "Cavity-Enhanced Room-Temperature Magnetometry Using Absorption by Nitrogen-Vacancy Centers in Diamond", Physical Review Letters 112, Apr. 23, 2014, pp. (160802-1)-(160802-5), American Physical Society.

Knauer et al., "Structured Polymer Waveguides on Distributed Bragg Reflector Coupling to Solid State Emitter", Journal of Optics 19(6), [065203]. 2017, https://doi.org/10.1088/2040/8986/aa6a70, pp. Cover pages through 9.

Sergaeva, et al., Resonant Dielectric Waveguide-Based Nanostructure for Efficient Interation With Color Centers in Nanodiamonds, Nanosystems: Physics, Chemistry, Mathematics, 2019, 10 (3), PACS 42.25.Fx, 42.79.e, 42.82 Gw, DOI 10.17586/2220-8054-2019-10-3-266-272, pp. 266 through 272.

U.S. Patent and Trademark Office, "Corrected Notice of Allowability", U.S. Appl. No. 16/786,495, filed May 14, 2021, pp. 1 through 6, Published: US.

U.S. Patent and Trademark Office, "Notice of Allowance", U.S. Appl. No. 16/786,495, filed Apr. 30, 2021, pp. 1 through 18, Published: US.

U.S. Patent and Trademark Office, "Notice of Allowance", U.S. Appl. No. 16/788,819, filed Aug. 18, 2021, pp. 1 through 9, Published: US.

U.S. Patent and Trademark Office, "Office Action", U.S. Appl. No. 16/788,819, filed Apr. 13, 2021, pp. 1 through 10, Published: US.

* cited by examiner

DELIVERY OF PUMP LASER INTO PROBE WAVEGUIDE USING OPTICAL DIFFRACTION

STATEMENT REGARDING FEDERALLY SPONSORED RESEARCH OR DEVELOPMENT

This invention was made with Government support under FA8650-20-C-7034 awarded by DARPA. The Government has certain rights in the invention.

BACKGROUND

Many applications use precise measurements of magnetic fields. In particular, many applications benefit from a measurement of the vector magnetic fields to produce a more detailed map of the magnetic field. For example, applications may measure magnetic fields in anomaly-based navigation and dipole beacon-based navigation. These applications typically require magnetic sensors with high sensitivity; low size, weight, and power; and the ability to operate in an earth field. Some technologies (i.e., superconducting quantum interference device (SQUID), atomic-based magnetometry) can provide high sensitivity that is useful in certain applications. However, some of these technologies have drawbacks. For example, SQUID uses cryogenic refrigeration, which adds to the size and power consumption of the magnetometer. Moreover, atomic-based magnetometers are unable to operate in an earth field. Further, the technologies mentioned above use at least three sensors to provide vector information.

SUMMARY

Systems and method for the delivery of a pump laser using optical diffraction are described herein. In certain embodiments, a system includes a substrate and a waveguide layer formed on the substrate. The waveguide layer includes a first waveguide of a first material configured to receive a probe laser for propagating within the first waveguide. The waveguide layer additionally includes a second waveguide configured to receive a pump laser for propagating within the second waveguide. Further, the waveguide layer includes one or more diffractors configured to direct a portion of the pump laser out of the second waveguide and through the first waveguide.

DRAWINGS

Drawings accompany this description and depict only some embodiments associated with the scope of the appended claims. Thus, the described and depicted embodiments should not be considered limiting in scope. The accompanying drawings and specification describe the exemplary embodiments, and features thereof, with additional specificity and detail, in which:

Per common practice, the drawings do not show the various described features according to scale, but the drawings show the features to emphasize the relevance of the features to the example embodiments.

DETAILED DESCRIPTION

The following detailed description refers to the accompanying drawings that form a part of the present specification. The drawings, through illustration, show specific illustrative embodiments. However, it is to be understood that other embodiments may be used and that logical, mechanical, and electrical changes may be made.

The present disclosure describes methods and systems for delivering a pump laser using optical diffraction. In particular, a system introduces a pump laser into a pump waveguide where a portion of the pump waveguide is proximate to a probe waveguide with a probe laser propagating therein. Further, the portions of the probe waveguide and the pump waveguide that extend proximate to one another are separated by a sufficient distance to prevent the coupling of light between the probe waveguide and the pump waveguide. Additionally, the pump waveguide includes diffractive optics that redirect the pump laser from the pump waveguide and through the probe waveguide.

In certain embodiments, some of the probe waveguide may be made from a first material that responds to magnetic fields. For example, the first material may absorb the probe laser in the presence of a microwave signal at a resonant frequency after being prepared by a pump laser, where the resonant frequency changes in response to changes in magnetic fields applied to the first material. Accordingly, by directing the pump laser out of the pump waveguide and through the probe waveguide using the diffractive optics, the amount of the probe laser absorbed by the first material of the probe waveguide may vary in response to the strength of magnetic fields experienced by the probe waveguide.

Figure 1:
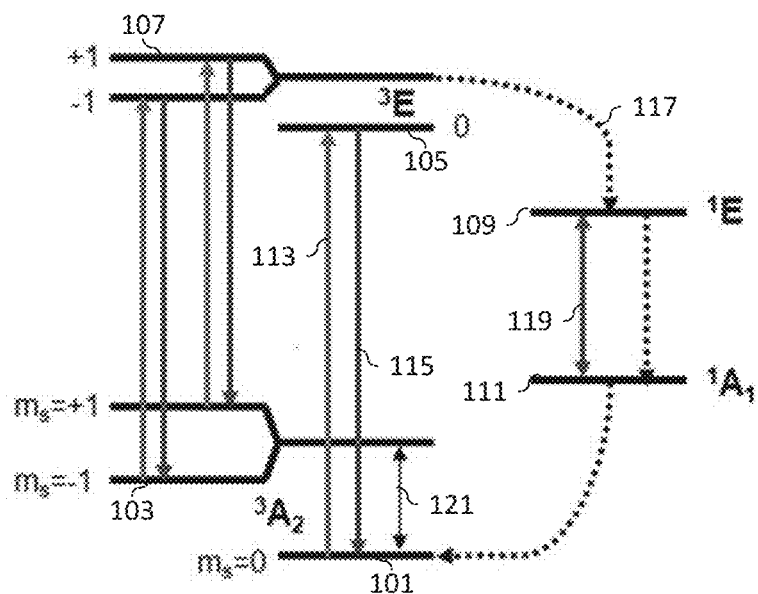
FIG. 1 is a diagram illustrating transitions between the various states of a particular material used for fabricating a magnetometer according to an aspect of the present disclosure.

FIG. 1 is a diagram illustrating transitions between the various states of a particular material that is sensitive to magnetic field changes, such that the material may be used within magnetometers. For example, some materials may have certain physical characteristics that allow the material to be responsive to magnetic field changes. Examples of materials responsive to magnetic field changes may include nitrogen-vacancy (NV) diamond, silicon carbide, or other material with similar physical characteristics. As used herein, NV diamond may refer to a diamond material having multiple point defects, where a point defect is a nearest-neighbor pair of a nitrogen atom substituted for a carbon atom and a lattice vacancy.

As illustrated, an exemplary material that responds to magnetic fields may have a ground state that is a spin-triplet state. In particular, a spin-triplet ground state may have three spin projections: a ground antiparallel 101 of spin projection 0 and two ground parallel spins 103 with spin projections of +/−1. The ground antiparallel spin 101 and the ground parallel spins 103 are separated by a resonant frequency 121. For example, in the absence of a magnetic field, when the material is NV diamond, the resonant frequency 121 may equal 2.87 GHz. Additionally, point defects within the material may be optically excited through spin-conserving transitions to a spin-triplet excited level. The spin-triplet excited level also has multiple spin projections: an excited antiparallel spin 105 of spin projection 0 and excited parallel spins 107 with spin projections of +/−1. The point defects of the first material become optically excited by exposure to pump light having a particular frequency. For example, in NV diamond, a laser having a wavelength of 532 nm may cause spin-conserving transitions from the ground triplet states to the excited triplet states.

When point defects within the first material are in an excited state, the defects may relax either through a radiative transition 115 or through an intersystem crossing 117. When point defects relax through a radiative transition 115, the point defect may fluoresce and return to one of the ground triplet states. For example, an NV diamond point defect fluoresces by emitting light with a wavelength of 637 nm during a radiative transition 115. Conversely, when point defects relax through an intersystem crossing 117, the point defects do not fluoresce and transition to a shelved state. A shelved state may be a shelved ground state 111 or a shelved excited state 109. Additionally, when point defects are in one of the shelved states 109 and 111, the point defects may absorb a probe laser 119 having a particular frequency. For example, NV diamond point defects in one of the shelved states 109 and 111 may absorb a probe laser 119 having a wavelength of 1042 nm.

In certain embodiments, applying a microwave frequency signal to the first material increases the rate of intersystem crossings 117 compared to radiative transitions 115. In the first material, non-radiative intersystem crossings 117 may be strongly spin selective. For example, point defects having a parallel spin 107 are more likely to experience an intersystem crossing 117 to one of the shelved states 109 and 111. In contrast, point defects having the excited antiparallel spin 105 are more likely to experience a radiative transition back to the ground triplet state. Applying a microwave frequency signal to the first material at a resonant frequency 121 increases the probability that the point defects have a parallel spin 107, increasing the probability of intersystem crossings 117. For example, the resonant frequency 121 may be 2.87 GHz when the material is NV diamond. Accordingly, applying a radio frequency of 2.87 GHz to the material may increase the probability of intersystem crossings 117 to one of the shelved states 109 and 111.

Additionally, applying a microwave signal at the resonant frequency 121 to the first material increases the population of point defects at the shelved states 109 and 111. Thus, the first material is more likely to absorb the probe laser 119. Accordingly, when the probe laser 119 is applied to the first material without the microwave signal at the resonant frequency 121, the first material absorbs the probe laser 119 at a rate determined by the steady state populations of the energy levels. Applying a microwave signal having a resonant frequency 121 of 2.87 GHz to NV diamond material causes the NV diamond material to absorb a probe laser 119 having a wavelength of 1042 nm at an increased rate.

In further embodiments, the resonant frequency 121 for the material may change in the presence of a magnetic field. For example, when the material is exposed to a magnetic field, the Zeeman effect may cause the resonant frequency 121 to experience a shift in proportion to the strength of the experienced magnetic field. In particular, in the presence of a magnetic field, the resonant frequency 121 may split into two different resonant frequencies 121, where the difference between the two resonant frequencies 121 is proportional to the experienced magnetic field. Accordingly, some systems may identify the resonant frequency 121 at which point defects absorb a probe laser 119 to determine the strength of a magnetic field experienced by the first material.

Additionally, the point defects within the first material may be in one of several orientations. For example, when the first material is NV diamond, each point defect may be in one of four different orientations. Additionally, the first material may have many point defects in each of the four orientations. Accordingly, a system may identify vector information for a magnetic field based on electrical signals that detect the probe laser 119 applied to the first material. For example, when the first material is exposed to a magnetic field, the resonant frequencies 121 for a point defect may shift based on the orientation of the point defect in relation to the experienced magnetic field. Thus, when the point defects in the material are in multiple different orientations, the point defects in the material may have separate resonant frequencies associated with each of the different orientations of the point defects. Therefore, vector information for the magnetic field may be determined by identifying which resonant frequencies correspond to the different orientations of the point defects in the material. In some implementations, systems apply biased magnetic fields to the material when determining which resonant frequencies are associated with particular orientations of the point defects.

In some embodiments described herein, a magnetometer may incorporate the first material and include components to direct a pump light 113 to illuminate the point defects within the first material such that the point defects move to the excited triplet state. The magnetometer may also include components that generate and expose the first material to RF energy in frequencies that include the resonant frequency 121 for the first material. As described above, the probability of intersystem crossings 117 to shelved states 109 and 111 increases at the resonant frequency 121. Additionally, the magnetometer may include components that generate and direct the propagation of a probe laser 119 to expose the first material to the probe laser 119. As described above, point defects in the shelved states 109 and 111 absorb the probe laser 119. Accordingly, the components associated with the RF energy may sweep the applied microwave signal through a range of frequencies to identify the resonant frequencies 121 associated with the different orientations of the point defects within the material. The magnetometer or connected system may identify the resonant frequencies 121 based on a detected decrease of the intensity of the probe laser 119 passing through the first material. The intensity of the probe laser 119 decreases because the point defects at the shelved state absorb the probe laser 119. Based on the identified resonant frequencies 121, the magnetometer or connected system may calculate the magnetic field experienced by the first material with high sensitivity to magnetic field changes; low size, weight, and power; and a robustness that could enable the use of a resulting magnetometer in many magnetic-based/aided applications, such as in navigation.

Figure 2:
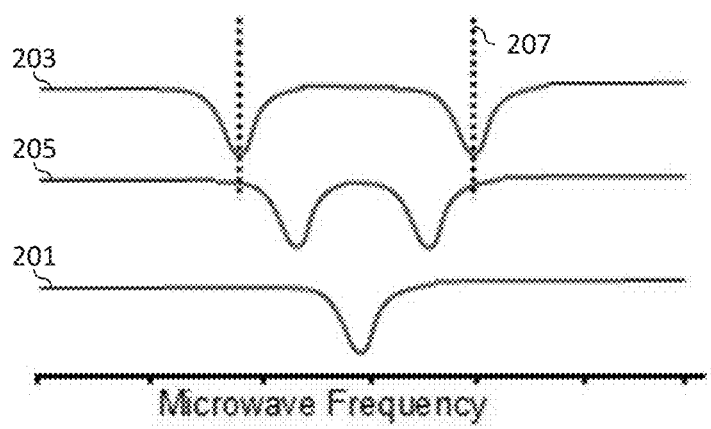
FIG. 2 is a graph illustrating the detection of a magnetic field based on the identification of resonance lines in an applied microwave field according to an aspect of the present disclosure.

FIG. 2 is a graph illustrating the detection of a magnetic field based on identifying resonance lines in an applied microwave field that is swept through a range of frequencies. As described above, a material may be exposed to a range of microwave frequencies, where the range of applied frequencies includes the different resonant frequencies for the material. Additionally, the different resonant frequencies are associated with the strength of the magnetic fields experienced by the material. Further, the first material may have different resonant frequencies associated with the different orientations of point defects within the material.

As illustrated, FIG. 2 shows various graphs of the intensity of a probe laser as emitted from the first material at different microwave frequencies applied to the first material for three different magnetic field strengths. For example, graph 201 shows the intensity of the emitted probe laser at different frequencies when the first material is not exposed to a magnetic field. When a probe laser is introduced into the first material in the absence of an applied magnetic field, the first material may not experience a Zeeman shift and the probe laser may be absorbed at a single resonant frequency for the first material. Accordingly, the intensity of the light associated with the graph 201 may decrease at the single resonant frequency for the first material.

Additionally, when the first material is exposed to different magnetic field strengths, the resonant frequency may experience a frequency shift in proportion to the experienced magnetic field strength. For example, graph 205 and graph 203 illustrate the intensity of the emitted probe laser by the first material in the presence of different magnetic field strengths. In this example, the magnetic field strength experienced by the first material associated with the graph 203 is greater than the magnetic field strength experienced by the first material associated with the graph 205. Accordingly, the magnitude of the shift of the resonant frequencies is greater when the material is exposed to a greater magnetic field strength. A system may identify the magnitude of the resonant frequency shift by identifying the frequencies 207 associated with decreases in the intensity of the probe laser emitted after passing through the first material. Based on the magnitude of the resonant frequency shift, a system may determine the magnetic field experienced by a point defect. Additionally, when there are multiple resonant frequencies, the system may identify the orientations of the point defects associated with the different resonant frequencies and the direction of the experienced magnetic field.

Figure 3:
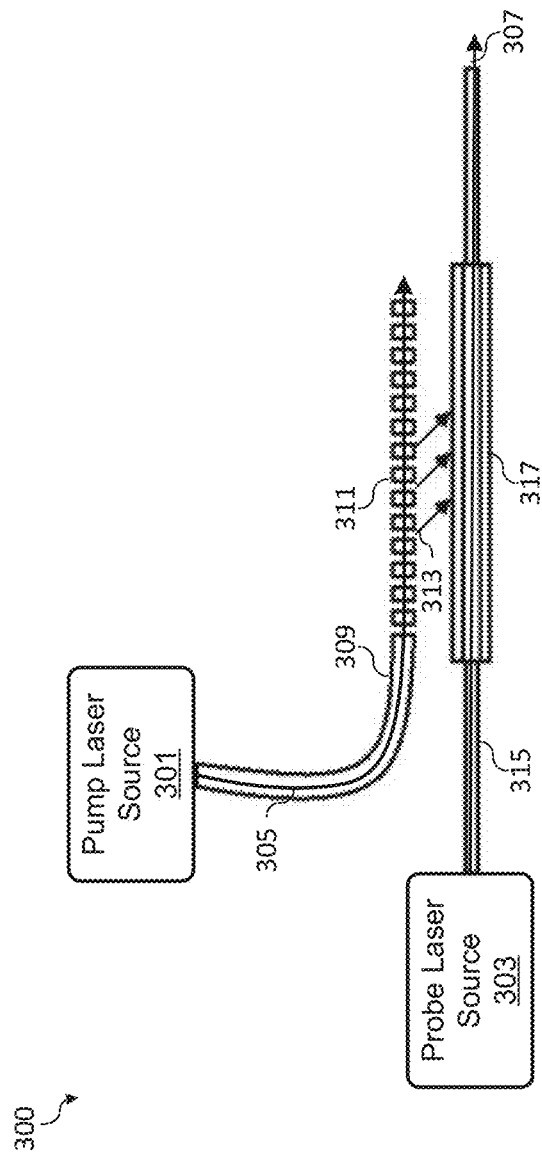
FIG. 3 is a block diagram of a system that delivers a pump laser using optical diffraction according to an aspect of the present disclosure.

FIG. 3 is a diagram illustrating a system 300 that introduces a pump laser into a material sensitive to magnetic changes using diffractive optics. For example, the material may be similar to the first material described above in connection with FIGS. 1 and 2. As illustrated, the system 300 includes a pump laser source 301 and a probe laser source 303. The pump laser source 301 is a device that generates a pump laser 305, where the pump laser 305 is a laser having a particular wavelength that optically excites point defects in a material similar to the pump light 113 described above in connection with FIG. 1. The probe laser source 303 is a device that generates a probe laser, where the probe laser 307 is a laser having a particular wavelength such that the probe laser 307 is absorbed by the point defects in a shelved state similar to the probe laser 119 as described above in connection with FIG. 1. For example, when the material having point defects sensitive to magnetic changes is NV diamond, the wavelength of the probe laser 307 is approximately 1042 nm, and the wavelength of the pump laser 305 is approximately 532 nm.

In certain embodiments, the pump laser source 301 provides the pump laser 305 for coupling into a pump laser waveguide 309. The pump laser waveguide 309 may receive the pump laser 305 from the pump laser source 301 and couples the pump laser 305 into a pump laser diffractor 311 that is formed as part of or connected to the pump laser waveguide 309. The pump laser diffractor 311 may receive the pump laser 305 and direct the pump laser 305 out of the pump laser waveguide 309 as an emitted pump laser 313. As used herein, the pump laser diffractor 311 may be a device that diffracts laser light. For example, the pump laser diffractor 311 may change the propagation direction of the pump laser 305, causing at least a portion of the emitted pump laser 313 to leave the pump laser waveguide 309. In some implementations, the diffractor 311 may be a diffraction grating, where a periodic variation in the refractive index of the pump laser waveguide 309 causes light having the wavelength of the pump laser 305 to propagate in a different direction.

In some embodiments, the probe laser source 303 provides the probe laser 307 for coupling into a probe laser waveguide 315. The probe laser waveguide 315 may receive the probe laser 307 from the probe laser source 303 and couple the probe laser 307 into an absorption region 317 of the probe laser waveguide 315. The absorption region 317 of the probe laser waveguide 315 is fabricated from a material having the properties of the first material described above in FIG. 1. Examples of such a material include NV diamond, silicon carbide, or other material having similar physical characteristics. In some implementations, the absorption region 317 of the probe laser waveguide 315 may extend in parallel to the diffractor 311 of the pump laser waveguide 309, but the relationship between the positions of the absorption region 317 of the probe laser waveguide 315 and the diffractor 311 of the pump laser waveguide 309 may be in other orientations. Further, sufficient distance may separate the probe laser waveguide 315 from the pump laser waveguide 309 to prevent light from inadvertently coupling between the probe laser waveguide 315 and the pump laser waveguide 309. Because of the sufficient distance between the probe laser waveguide 315 and the pump laser waveguide 309, the probe laser waveguide 315 and the pump laser waveguide 309 need not be mode matched.

In exemplary embodiments, the pump laser diffractor 311 directs the emitted pump laser 313 to exit the pump laser waveguide 309 and pass through the absorption region 317 of the probe laser waveguide 315. Thus, the emitted pump laser 313 may pass through the absorption region 317, where the emitted pump laser 313 excites point defects in the absorption region 317. The excited point defects in the absorption region 317 may transition to a shelved state in the presence of a microwave signal at a resonant frequency for the point defects. In the shelved state, the point defects of the absorption region 317 may absorb photons of the probe laser 307. As the resonant frequency of the point defects changes in response to a magnetic field, adjusting the frequency of the applied microwave signal while monitoring the intensity of the 307 after passing through the absorption region 317 can help identify the resonant frequency of the point defects within the absorption region 317. The magnetic field experienced by the absorption region 317 can be determined based on the identified resonant frequency.

Figure 4A:
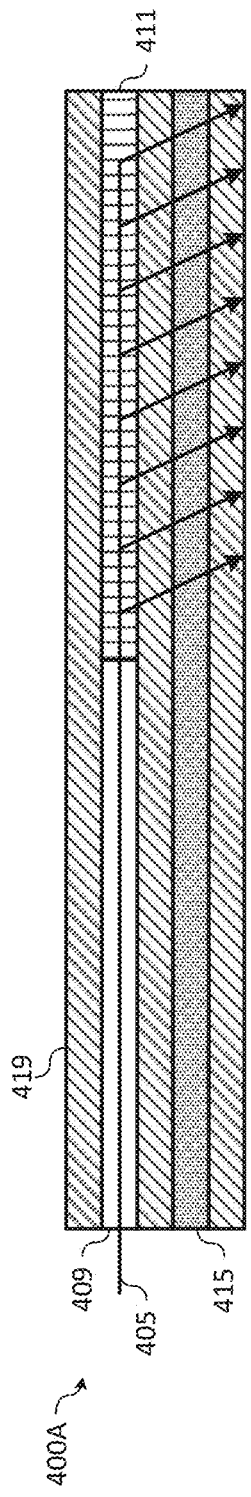
FIGS. 4A-4C illustrates various cross-section illustrations of waveguide structures that use diffraction to deliver a pump laser according to an aspect of the present disclosure.
Figure 4B:
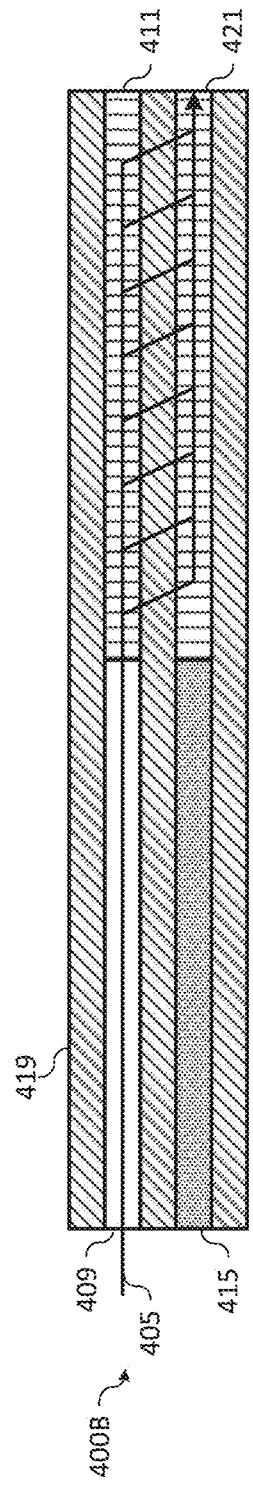
Figure 4C:
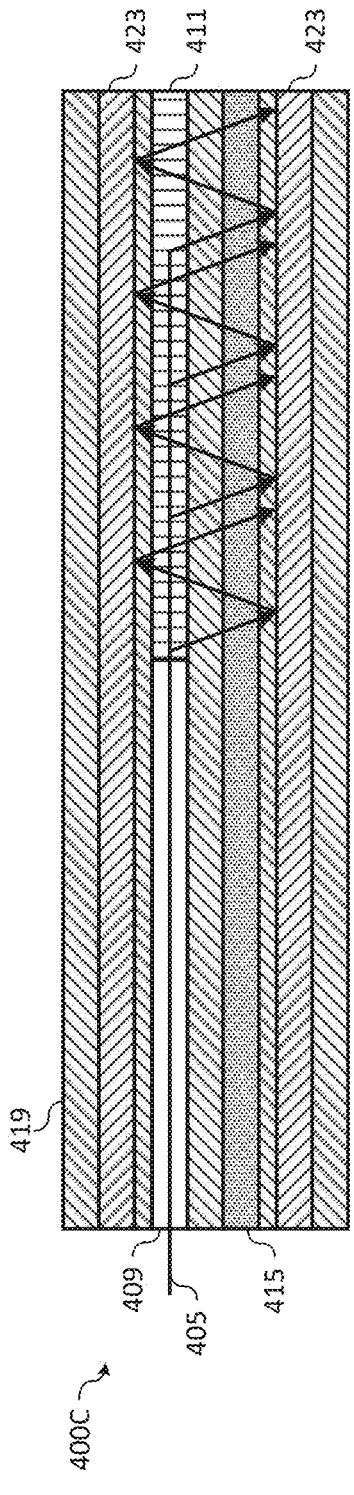

FIGS. 4A-4C illustrate different cross-sections of implementations for diffracting the pump laser 405 through an absorption region of the probe laser waveguide 415 with point defects. For example, FIG. 4A illustrates a pump laser 409 being emitted out of a pump laser waveguide 409 to pass through the probe laser waveguide 415. FIG. 4B illustrates a pump laser 409 being emitted out of the pump laser waveguide 409 to be redirected for propagation through the probe laser waveguide 415. FIG. 4C illustrates a pump laser waveguide 409 being emitted out of the pump laser waveguide 409, where multiple reflecting layers 423 cause the emitted pump laser to pass multiple times through the probe laser waveguide 415.

Figure 9:
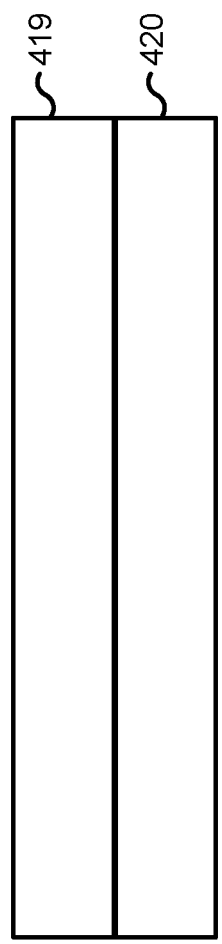
FIG. 9 is a cross-section illustrating the location of a waveguide layer on a substrate according to an aspect of the present disclosure.

FIG. 4A illustrates a cross-section of a waveguide structure 400A that causes a pump laser 405 to be diffracted out of a pump laser waveguide 409, where the diffracted pump laser 405 passes through a portion of the probe laser waveguide 415. As shown, the pump laser waveguide 409 and the probe laser waveguide 415 are fabricated within a waveguide layer 419, which, as shown in FIG. 9, is formed on a substrate 420. The substrate 420 may be fabricated from any material capable of supporting the fabrication of additional layers thereon. For example, the substrate 420 may be a silicon substrate but could be a substrate formed from a similar material. In particular, the waveguide layer 419 may be fabricated over a surface of the substrate 420 using combinations of deposition, masking, and etching techniques known to one having skill in the art. The pump laser waveguide 409 (containing the pump laser diffractor 411) and the probe laser waveguide 415 are fabricated as part of the waveguide layer 419. The waveguide layer 419 may be fabricated from silicon dioxide or other similar material that would permit the passage of light between the pump laser waveguide 409 and the probe laser waveguide 415. Further, the pump laser diffractor 411 may function similarly to the pump laser diffractor 311 in FIG. 3.

In certain embodiments, the pump laser 405 is introduced into the pump laser waveguide 409. The pump laser 405 then propagates along the pump laser waveguide 409 until the pump laser 405 enters the portion of the pump laser waveguide 409 containing the pump laser diffractor 411. When the pump laser 405 enters the portion of the pump laser waveguide 409 containing the pump laser diffractor 411, the pump laser diffractor 411 may diffract the pump laser 405 out of the pump laser waveguide 409 towards the probe laser waveguide 415 through the waveguide layer 419. The pump laser 405 may then pass through an absorption region of the probe laser waveguide 415, where a portion of the pump laser 405 may be absorbed by a portion of the point defects within the absorption region of the probe laser waveguide 415. The portion of the pump laser 405 that is not absorbed by the point defects within the probe laser waveguide 415 may pass through the waveguide layer 419. By using the pump laser diffractor 411 to direct the pump laser 405 towards the probe laser waveguide 415 through the waveguide layer 419, the pump laser waveguide 409 and the probe laser waveguide 415 may be separated by a sufficient distance to prevent the inadvertent coupling of light between the pump laser waveguide 409 and the probe laser waveguide 415.

FIG. 4B illustrates a cross-section of a waveguide structure 400B that causes a pump laser 405 to be diffracted out of a pump laser waveguide 409 towards a probe laser waveguide 415. When the pump laser 405 enters the probe laser waveguide 415, a probe waveguide diffractor 421 formed within the probe laser waveguide 415 may diffract the pump laser 405 such that the pump laser 405 begins to propagate within the probe laser waveguide 415. As shown, the pump laser waveguide 409, the pump laser diffractor 411, and the waveguide layer 419 of the waveguide structure 400B may be formed in a similar manner and function similarly to the pump laser waveguide 409, pump laser diffractor 411, and waveguide layer 419 of the waveguide structure 400A in FIG. 4A. However, in the waveguide structure 400B, the probe laser waveguide 415 may have a probe waveguide diffractor 421 formed therein. Like the pump laser diffractors 311 and 411, the probe waveguide diffractor 421 may be a diffraction grating or other type of suitable optical component.

In certain embodiments, the pump laser 405 is introduced into the pump laser waveguide 409. The pump laser 405 then propagates along the pump laser waveguide 409 until the pump laser 405 enters the portion of the pump laser waveguide 409 containing the pump laser diffractor 411. When the pump laser 405 enters the portion of the pump laser waveguide 409 containing the pump laser diffractor 411, the pump laser diffractor 411 may diffract the pump laser 405 out of the pump laser waveguide 409 towards the probe laser waveguide 415 through the waveguide layer 419. The pump laser 405 may then be incident on the probe waveguide diffractor 421, where the probe waveguide diffractor 421 diffracts the pump laser 405 to propagate through the probe laser waveguide 415 within the absorption region. As the pump laser 405 propagates through the probe laser waveguide 415, the pump laser 405 may be absorbed by the point defects within the absorption region of the probe laser waveguide 415. Thus, in contrast to the waveguide structure 400A, where the light passes through the probe laser waveguide 415 without propagating down the probe laser waveguide 415 or being absorbed by point defects in the probe laser waveguide 415, the point defects within the probe laser waveguide 415 of the waveguide structure 400B absorb a larger portion of the pump laser 405 that is diffracted out of the pump laser waveguide 409. Using the pump laser diffractor 411 to direct the pump laser 405 towards the probe laser waveguide 415 and the probe waveguide diffractor 421 to direct the incident pump laser 405 to propagate through the probe laser waveguide 415 allows for a significant portion of the pump laser 405 to be absorbed by the point defects while allowing for the separation of the pump laser waveguide 409 and the probe laser waveguide 415 by a sufficient distance to prevent the inadvertent coupling of light between the pump laser waveguide 409 and the probe laser waveguide 415.

FIG. 4C illustrates a cross-section of a waveguide structure 400C that causes a pump laser 405 to be diffracted out of a pump laser waveguide 409 towards a probe laser waveguide 415. After the pump laser 405 passes through the probe laser waveguide 415, the pump laser 405 may be reflected between different reflective layers 423, where the pump laser waveguide 409 and the probe laser waveguide 415 are positioned between the reflective layers 423. As shown, the pump laser waveguide 409, the pump laser diffractor 411, and the probe laser waveguide 415 of the waveguide structure 400C may be formed in a similar manner and function similarly to the pump laser waveguide 409, pump laser diffractor 411, and probe laser waveguide 415 of the waveguide structure 400A in FIG. 4A. However, in the waveguide structure 400C, the waveguide layer 419 may have additional reflective layers 423 formed therein. The reflective layers 423 may be mirrors or other optical components capable of reflecting light within the waveguide layer 419.

In certain embodiments, the pump laser 405 is introduced into the pump laser waveguide 409. The pump laser 405 then propagates along the pump laser waveguide 409 until the pump laser 405 enters the portion of the pump laser waveguide 409 containing the pump laser diffractor 411. When the pump laser 405 enters the portion of the pump laser waveguide 409 containing the pump laser diffractor 411, the pump laser diffractor 411 may diffract the pump laser 405 out of the pump laser waveguide 409 towards the probe laser waveguide 415 through the waveguide layer 419. The pump laser 405 may then pass through an absorption region of the probe laser waveguide 415, where point defects may absorb a portion of the pump laser 405 within the absorption region of the probe laser waveguide 415. The portion of the pump laser 405 that is not absorbed by the point defects within the probe laser waveguide 415 may pass through the waveguide layer 419 and be incident on one of the reflective layers 423. The reflective layer 423 then reflects the pump laser 405 such that the pump laser 405 passes through both the probe laser waveguide 415 and the pump laser waveguide 409 and is incident upon a second reflective layer 423. The second reflective layer 423 may then reflect the pump laser 405 back towards the first reflective layer 423. Thus, the pump laser 405 is repeatedly reflected between the reflective layers 423. With each pass through the probe laser waveguide 415, a portion of the pump laser 405 may be absorbed by point defects within the absorption region of the probe laser waveguide 415. By using the reflective layers 423 to cause the diffracted pump laser 405 to pass through the probe laser waveguide 415 repeatedly, the pump laser waveguide 409 and the probe laser waveguide 415 may be separated by a sufficient distance to prevent the inadvertent coupling of light between the pump laser waveguide 409 and the probe laser waveguide 415 while still allowing for a significant portion of the pump laser 405 to be absorbed by the point defects within the probe laser waveguide 415.

Various fabrication techniques may be used when fabricating one of the waveguide structures 400A-400C. In one embodiment, as shown in FIG. 9. a waveguide layer 419 of silicon may be deposited over a substrate 420. After the deposition of the silicon of the waveguide layer 419, the waveguide layer 419 may be masked for the fabrication of the various waveguide structures and potential reflective layers. After masking, the waveguide layer 419 may be etched or doped using various processes to form the structures described above as part of the waveguide layer 419. Alternatively, the waveguide structures and potential reflective layers may be fabricated over a surface of the substrate 420, and then the silicon (or other similar material) may be deposited around the structures. Other potential techniques known to one having skill in the art may also be used to fabricate the structures described herein.

Figure 5A:
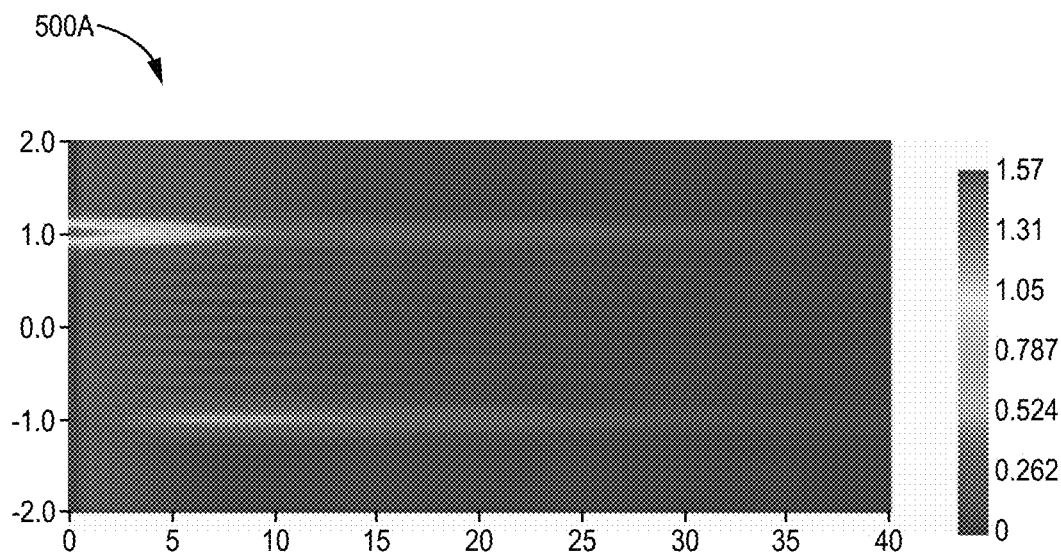
FIGS. 5A-5B illustrate the intensity of a pump laser within a waveguide layer according to an aspect of the present disclosure.
Figure 5B:
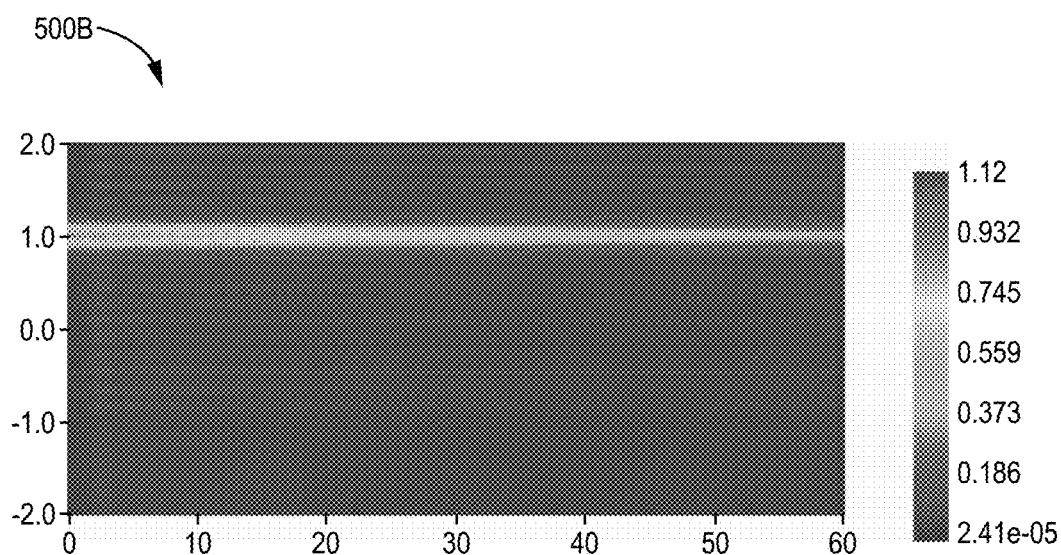

FIGS. 5A and 5B are graphs 500A and 500B illustrating the intensity of a pump laser within the waveguide layer 419 in waveguide structures 400A and 400B, respectively. For example, FIG. 5A shows a graph 500A of the intensity of the pump laser 405 where only the pump laser waveguide 409 has a pump laser diffractor 411. As shown, one region of light decreases in intensity as the pump laser propagates across the waveguide layer 419. The decrease in intensity occurs due to the progressive diffraction of the light out of the pump laser waveguide 409 by the pump laser diffractor 411. As the light passes through the probe laser waveguide 415 and then out of the waveguide layer 419, the pump laser doesn't markedly increase in intensity within regions of the waveguide layer 419 outside of the area associated with the location of the pump laser waveguide 409.

Conversely, in FIG. 5B, the graph 500A shows the intensity of the pump laser 405 where the pump laser waveguide 409 has a pump laser diffractor 411 and the probe laser waveguide 415 has a probe waveguide diffractor 421. As shown, there are two regions of the waveguide layer 419 where the pump laser 405 has a measurable intensity, an upper region associated with the pump laser waveguide 409 and a lower region associated with the probe laser waveguide 415. Within the pump laser waveguide 409, the pump laser 405 decreases in intensity within the upper region associated with the pump laser waveguide 409 as the pump laser propagates across the waveguide layer 419. The decrease in intensity within the pump laser waveguide 409 occurs due to the progressive diffraction of the light out of the pump laser waveguide 409 by the pump laser diffractor 411. Within the lower region associated with the probe laser waveguide 415, there is initially no pump laser 405 within the probe laser waveguide 415, but as the pump laser 405, diffracted from the pump laser waveguide 409, enters the probe laser waveguide 415, the probe waveguide diffractor 421 direct the 405 to propagate down the probe laser waveguide 415. Thus, the pump laser 405 intensifies within the lower region associated with the probe laser waveguide 415. As the pump laser 405 propagates along the 415, the point defects absorb the pump laser 405. Accordingly, the intensity of the pump laser 405 decreases as the pump laser 405 propagates through the probe laser waveguide 415.

Figure 6:
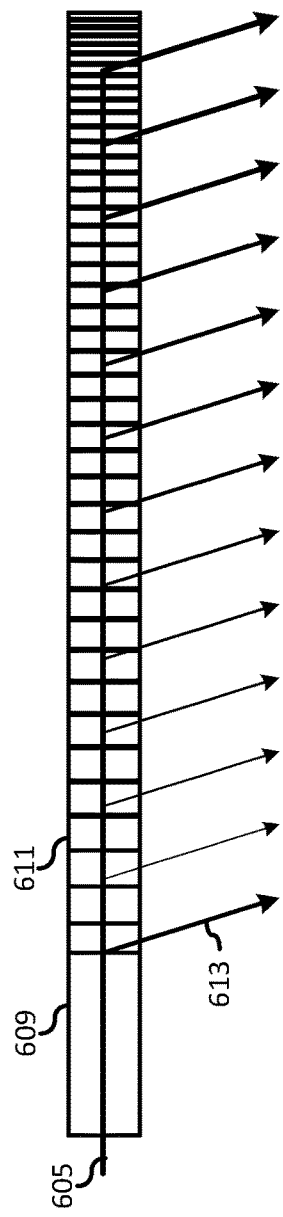
FIG. 6 is a diagram illustrating a waveguide having a chirped optical grating for delivering a pump laser according to an aspect of the present disclosure.

FIG. 6 is a diagram illustrating a chirped diffraction grating 611 within a pump laser waveguide 609. As illustrated, a pump laser 605 propagates within a pump laser waveguide 609 and enters a chirped diffraction grating 611. The pump laser 605 and the pump laser waveguide 609 may function substantially similar to the pump laser 305 and the pump laser waveguide 309 described above in FIG. 3. The chirped diffraction grating 611 is an example of a type of diffractor that could direct the emitted pump laser 613 towards a probe laser waveguide such as the probe laser waveguide 315 in FIG. 3. As used herein, a chirped diffraction grating 611 may be a grating with a linear variation in the grating period that diffracts the pump laser 605 out of the pump laser waveguide 609 with increasing strength as the light propagates through the pump laser waveguide 609. For example, the chirped diffraction grating 611 may extend along a diffractive length of the pump laser waveguide 609, wherein the portion of the pump laser 605 directed out of the second waveguide increases along the diffractive length. While a chirped diffraction grating 611 is shown, the diffractor may be a different type of diffraction gratings or other diffraction device.

Figure 7:
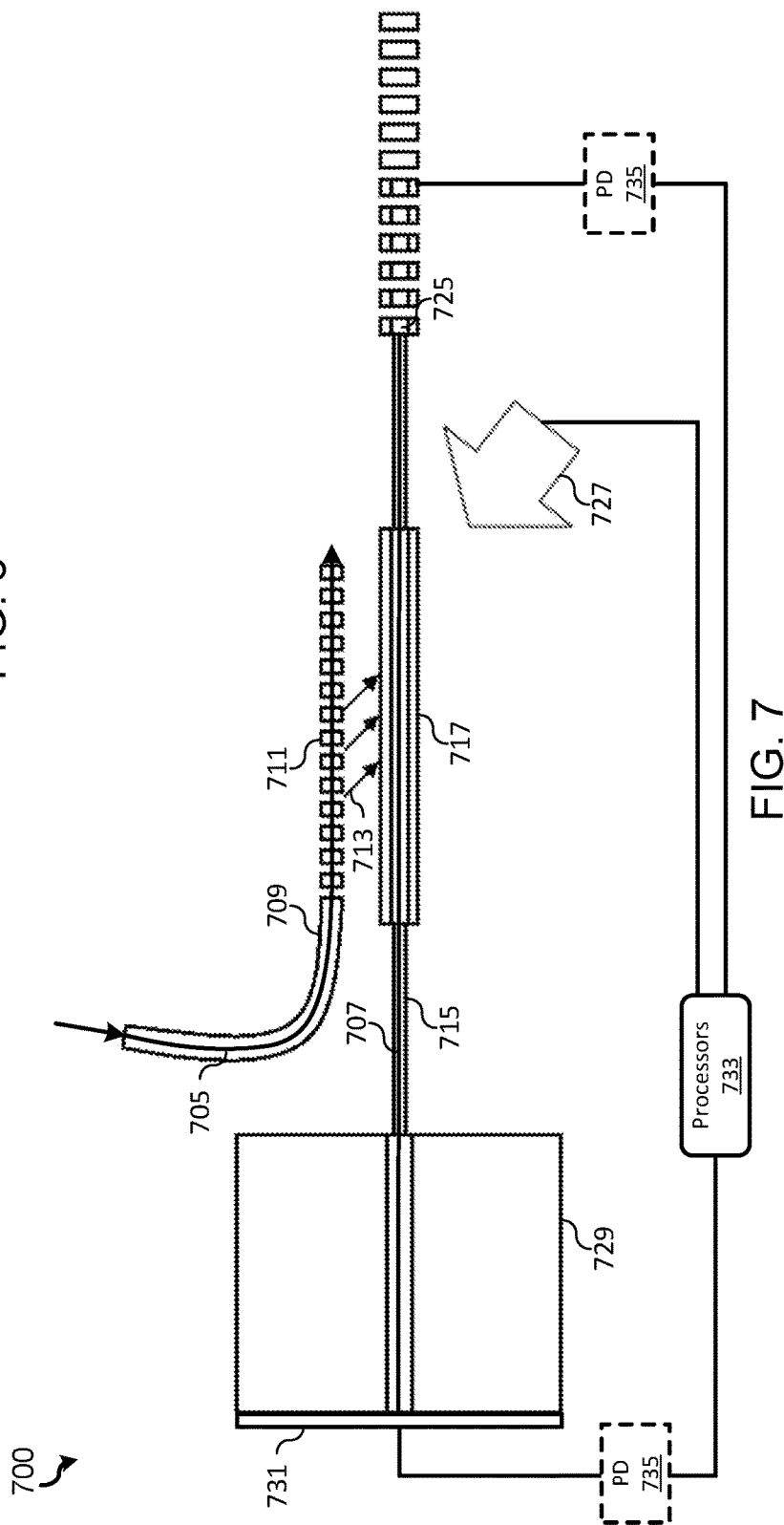
FIG. 7 is a diagram of a system that uses optical diffraction for delivering a pump laser according to an aspect of the present disclosure.

FIG. 7 is a diagram of a system 700 that implements a system for delivering a pump laser into an absorption region 717 of a probe laser optical path 715. For example, the system 700 may be a type of magnetometer that uses a material having point defects in a manner similar to the material described in accordance with FIG. 1. Additionally, the pump laser 705 is provided through a pump laser waveguide 709 to a pump laser diffractor 711 that diffracts the pump laser 705 out of the pump laser waveguide 709 as an emitted pump laser 713 in a similar manner as described above related to the pump laser 305, pump laser waveguide 309, pump laser diffractor 311, and the emitted pump laser 313 in FIG. 3. Similarly, the probe laser waveguide 715 and absorption region 717 may function like the probe laser waveguide 315 and the absorption region 317 in FIG. 3. Accordingly, the system 700 uses the pump laser diffractor 711 to direct the pump laser 705 out of the pump laser waveguide 709 through the absorption region 717.

As illustrated, the system 700 includes a gain medium 729 that emits light at the frequency of the probe laser 707 and introduces the light into the probe laser optical path 715. For example, the probe laser optical path 715 may include at least one interconnect that couples the 729 to the absorption region 717 of the probe laser optical path 715. As used herein, an interconnect is a portion along an optical path that connects components along the optical path. Accordingly, the gain medium 729 may function as an optical amplifier that introduces the probe laser 707 into the interconnect, which couples the probe laser 707 into the absorption region 717.

In further embodiments, the probe laser 707 may be reflected to pass repeatedly through the absorption region 717. For example, while excited point defects may absorb a portion of the probe laser 707 within the absorption region 717, a portion of the probe laser 707 may pass through the absorption region 717 into an additional interconnect that couples the absorption region 717 to a reflective component 725. The reflective component 725 may be a mirror, a grating mirror, or other type of component capable of reflecting the probe laser 707. The reflective component 725 reflects the probe laser 707 back through the absorption region 717, where an additional portion of the probe laser 707 may be absorbed by point defects within the absorption region 717. An unabsorbed portion of the probe laser 707 may then be coupled back into the gain medium 729 by an interconnect. The 707 that enters the gain medium 729 may pass through the 729 to be reflected by a back layer 731 attached to the gain medium 729. The back layer 731 may be a mirror or other reflective component that reflects the light back into the absorption region 717 for propagating along the probe laser optical path 715. Thus, the probe laser 707 can repeatedly pass through the absorption region 717.

In certain embodiments, the system 700 (in particular, the absorption region 717) may operate in the presence of microwave radiation 727 produced by a microwave radiation source, where the microwave radiation 727 is swept through a range of frequencies that includes possible resonant frequencies for the material of the absorption region 717. When the frequency of the microwave radiation 727 is at the resonant frequency of the material of the absorption region 717, the intensity of the laser propagating within the probe laser optical path 715 may decrease. The intensity of the light propagating may be detected by a photodetector 735 or other photodetection device to generate an electrical signal indicative of the intensity of the probe laser propagating within the probe laser optical path 715. For example, the back layer 731 may be coupled to or include a photodetector 735. As such, when the light is incident on the back layer, the back layer 731 may produce an electrical signal indicative of the intensity of the probe light propagating along the probe laser optical path 715. In an alternative implementation embodiment, a portion of the light incident on the reflective component 725 can be coupled to a photodetector 735 to produce the electrical signal indicative of the intensity of the probe light propagating along the probe laser optical path 715.

In certain embodiments, one or more processors 733 may receive the electrical signals produced by the photodetectors 735 and process the information contained within the electrical signal to calculate the strength of magnetic fields experienced by the absorption region 717. Further, the processors 733 may control the frequency of the microwave fields. By varying the frequency of the microwave fields and monitoring the intensity of the probe light, the processor 733 may identify one or more frequencies associated with a decrease in the probe light intensity. Using the frequencies, the processors 733 can determine the strength of the magnetic field experienced by the absorption region 717.

A processor or processors used to process information in the electrical signal to calculate the strength of the magnetic fields, or other systems and methods described herein, may be implemented using software, firmware, hardware, or appropriate combinations thereof. The processor may be supplemented by, or incorporated in, specially-designed application-specific integrated circuits (ASICs) or field programmable gate arrays (FPGAs). The processor and other computational devices can also include or function with software programs, firmware, or other computer-readable instructions for carrying out various process tasks, calculations, and control functions used in the methods and systems described herein.

Figure 8:
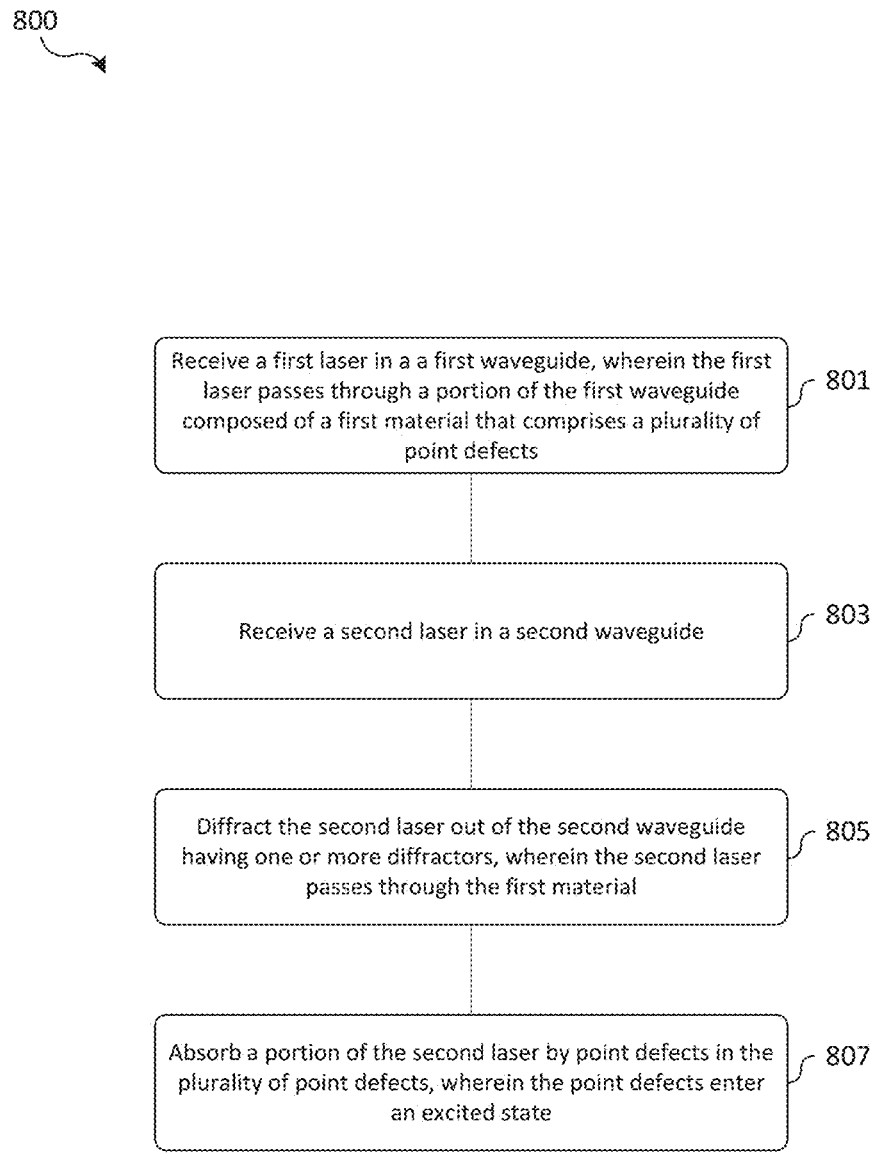
FIG. 8 is a flowchart diagram of a method for delivering a pump laser using optical diffraction according to an aspect of the present disclosure.

FIG. 8 depicts a flow diagram illustrating an exemplary method 800 for the delivery of a pump laser using optical diffraction. The method 800 may be implemented via the techniques described with respect to FIGS. 1-7, but may be implemented using other techniques known to one having skill in the art. The blocks of the flow diagram have been arranged in a generally sequential manner to facilitate explanation. But, the arrangement of the blocks is merely exemplary, and the blocks can be arranged in any manner sufficient to provide the functionality described above with respect to FIGS. 1-7. For example, light can be received by the different waveguides in different orders than as shown herein.

As shown in FIG. 8, the method 800 proceeds at 801, where a first laser is received in a first waveguide, wherein the first laser passes through a portion of the first waveguide composed of a first material that comprises a plurality of point defects. For example, a probe laser source produces a probe laser as described above. Further, systems described above may couple the probe laser into a waveguide, where a portion of the waveguide extends through the first material having point defects, such as the absorption region described above as part of the probe laser waveguide. The method 800 proceeds at 803, where a second laser is received in a second waveguide. For example, a pump laser source produces a pump laser that is introduced into a pump laser waveguide.

The method 800 proceeds at 805, where the second laser is diffracted out of the second waveguide having one or more diffractors, wherein the second laser passes through the first material. For example, the second waveguide includes diffractive optics or couples the second waveguide into diffractive optics that diffract the second laser out of the optical path associated with the second waveguide. The method 800 proceeds at 807, where a portion of the second laser is absorbed by point defects in the plurality of point defects, wherein the point defects enter an excited state. For example, when the second laser is diffracted out of the second waveguide, the second laser passes through the first waveguide, where some of the second laser is absorbed by the point defects to cause the point defects to enter the excited state. As described above, when a point defect is in the excited state and is exposed to RF signals at a particular resonant frequency, the point defects may transition to a shelved state, where the point defect can absorb the first laser.

Example Embodiments

Example 1 includes a system comprising: a substrate; and a waveguide layer formed on the substrate, the waveguide layer comprising: a first waveguide of a first material configured to receive a probe laser for propagating within the first waveguide; a second waveguide configured to receive a pump laser for propagating within the second waveguide; and one or more diffractors configured to direct a portion of the pump laser out of the second waveguide and through the first waveguide.

Example 2 includes the system of Example 1, wherein the one or more diffractors comprise a Bragg grating formed in the second waveguide, wherein the Bragg grating is configured to diffract the portion of the pump laser to pass through the first waveguide.

Example 3 includes the system of any of Examples 1-2, wherein the one or more diffractors further comprise a probe waveguide diffractor formed in the first waveguide, wherein the probe waveguide diffractor is configured to diffract the portion of the pump laser passing through the first waveguide to propagate within the first waveguide.

Example 4 includes the system of any of Examples 1-3, wherein the one or more diffractors further comprise a plurality of reflective layers configured to reflect the portion of the pump laser between the plurality of reflective layers, wherein the first waveguide and the second waveguide are between the plurality of reflective layers.

Example 5 includes the system of any of Examples 1-4, wherein the first material is nitrogen-vacancy diamond.

Example 6 includes the system of any of Examples 1-5, wherein the one or more diffractors extends along a diffractive length of the second waveguide, wherein the portion of the pump laser directed out of the second waveguide increases along the diffractive length.

Example 7 includes the system of Example 6, wherein the one or more diffractors comprise a chirped Bragg grating along the diffractive length.

Example 8 includes the system of any of Examples 1-7, wherein the second waveguide is separated from the first waveguide by a separation distance when the portion of the pump laser is directed out of the second waveguide, wherein the separation distance prevents the pump laser while propagating within the second waveguide from interacting with the probe laser propagating within the first waveguide.

Example 9 includes a system comprising: a first laser source configured to generate a first laser; a second laser source configured to generate a second laser; a first waveguide of a first material configured to receive the first laser from the first laser source; a second waveguide configured to receive the second laser from the second laser source; one or more diffractors configured to direct a portion of the second laser out of the second waveguide and through the first material of the first waveguide; a microwave radiation source configured to direct microwave radiation at the first material over a range of frequencies; at least one photodetector configured to generate at least one electrical signal by detecting the first laser after propagating through the first material; and one or more processors configured to receive the at least one electrical signal and control the range of frequencies of the microwave radiation, wherein the one or more processors is configured to determine a magnetic field based on a frequency in the range of frequencies associated with a decrease in the intensity of the first laser after passing through the first material.

Example 10 includes the system of Example 9, wherein the one or more diffractors comprise a Bragg grating formed in the second waveguide.

Example 11 includes the system of any of Examples 9-10, wherein the one or more diffractors further comprise a first waveguide diffractor formed in the first waveguide, wherein the first waveguide diffractor is configured to diffract the portion of the second laser passing through the first material to propagate within the first material.

Example 12 includes the system of any of Examples 9-11, wherein the one or more diffractors further comprise a plurality of reflective layers configured to reflect the portion of the second laser between the plurality of reflective layers, wherein the first waveguide and the second waveguide are between the plurality of reflective layers.

Example 13 includes the system of any of Examples 9-12, wherein the first material is nitrogen-vacancy diamond.

Example 14 includes the system of any of Examples 9-13, wherein the one or more diffractors extends along a diffractive length of the second waveguide, wherein the portion of the second laser directed out of the second waveguide increases along the diffractive length.

Example 15 includes the system of Example 14, wherein the one or more diffractors comprise a chirped Bragg grating along the diffractive length.

Example 16 includes the system of any of Examples 9-15, wherein the second waveguide is separated from the first waveguide by a separation distance when the portion of the second laser is directed out of the second waveguide, wherein the separation distance prevents the second laser while propagating within the second waveguide from interacting with the first laser propagating within the first waveguide.

Example 17 includes a method comprising: receiving a first laser in a first waveguide, wherein the first laser passes through a portion of the first waveguide composed of a first material that comprises a plurality of point defects; receiving a second laser in a second waveguide; diffracting the second laser out of the second waveguide having one or more diffractors, wherein the second laser passes through the first material; and absorbing a portion of the second laser by point defects in the plurality of point defects, wherein the point defects enter an excited state.

Example 18 includes the method of Example 17, further comprising: applying a microwave signal to the first material, wherein the microwave signal is at a resonant frequency of the first material; and absorbing a portion of the first laser by the point defects that are in the excited state.

Example 19. The method of Example 17, further comprising diffracting the second laser as it passes through the first material with a first waveguide diffractor formed in the first waveguide such that the second laser propagates within the first material.

Example 20 includes the method of any of Examples 17-18, further comprising reflecting the second laser between a plurality of reflective layers, wherein the first waveguide and the second waveguide are between the plurality of reflective layers, wherein the second laser passes through the first material after being reflected off of a reflective layer in the plurality reflective layers.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof

What is claimed is:
1. A system comprising:
a substrate; and
a waveguide layer formed on the substrate, the waveguide layer comprising:
  a first waveguide of a first material configured to receive a probe laser for propagating within the first waveguide;

a second waveguide configured to receive a pump laser for propagating within the second waveguide;

a first diffractor configured to direct a portion of the pump laser out of the second waveguide and through the first waveguide; and a probe waveguide diffractor formed in the first waveguide, wherein the probe waveguide diffractor is configured to diffract the portion of the pump laser passing through the first waveguide to propagate within the first waveguide.

2. The system of claim 1, wherein the first diffractor comprises a Bragg grating formed in the second waveguide, wherein the Bragg grating is configured to diffract the portion of the pump laser to pass through the first waveguide.

3. The system of claim 1, the waveguide layer further comprising a plurality of reflective layers configured to reflect the portion of the pump laser between the plurality of reflective layers, wherein the first waveguide and the second waveguide are between the plurality of reflective layers.

4. The system of claim 1, wherein the first material is nitrogen-vacancy diamond.

5. The system of claim 1, wherein the first diffractor extends along a diffractive length of the second waveguide, wherein the portion of the pump laser directed out of the second waveguide increases along the diffractive length.

6. The system of claim 5, wherein the first diffractor comprise a chirped Bragg grating along the diffractive length.

7. The system of claim 1, wherein the second waveguide is separated from the first waveguide by a separation distance when the portion of the pump laser is directed out of the second waveguide, wherein the separation distance prevents the pump laser while propagating within the second waveguide from interacting with the probe laser propagating within the first waveguide.

8. A system comprising:
a probe laser source configured to generate a probe laser;
a pump laser source configured to generate a pump laser;
a first waveguide of a first material configured to receive the probe laser from the probe laser source;
a second waveguide configured to receive the pump laser from the pump laser source;
a first diffractor configured to direct a portion of the pump laser out of the second waveguide and through the first material of the first waveguide;
a microwave radiation source configured to direct microwave radiation at the first material over a range of frequencies;
at least one photodetector configured to generate at least one electrical signal by detecting the probe laser after propagating through the first material; and
one or more processors configured to receive the at least one electrical signal and control the range of frequencies of the microwave radiation, wherein the one or more processors is configured to determine a magnetic field based on a frequency in the range of frequencies associated with a decrease in the intensity of the probe laser after passing through the first material; and
a second waveguide diffractor formed in the first waveguide, wherein the second waveguide diffractor is configured to diffract the portion of the pump laser passing through the first material to propagate within the first material.

9. The system of claim 8, wherein the first diffractor comprises a Bragg grating formed in the second waveguide.

10. The system of claim 8, the waveguide layer further comprising a plurality of reflective layers configured to reflect the portion of the pump laser between the plurality of reflective layers, wherein the first waveguide and the second waveguide are between the plurality of reflective layers.

11. The system of claim 8, wherein the first material is nitrogen-vacancy diamond.

12. The system of claim 8, wherein the first diffractor extends along a diffractive length of the second waveguide, wherein the portion of the pump laser directed out of the second waveguide increases along the diffractive length.

13. The system of claim 12, wherein the first diffractor comprises a chirped Bragg grating along the diffractive length.

14. The system of claim 8, wherein the second waveguide is separated from the first waveguide by a separation distance when the portion of the pump laser is directed out of the second waveguide, wherein the separation distance prevents the pump laser while propagating within the second waveguide from interacting with the first laser propagating within the first waveguide.

* * * * *